(12) United States Patent
Chuang et al.

(10) Patent No.: US 11,007,751 B2
(45) Date of Patent: *May 18, 2021

(54) IMPACT RESISTANT STRUCTURE AND ELECTRONIC DEVICE

(71) Applicants: Industrial Technology Research Institute, Hsinchu (TW); Intellectual Property Innovation Corporation, Hsinchu (TW)

(72) Inventors: Jui-Chang Chuang, Kaohsiung (TW); Chen-Chu Tsai, Taichung (TW); Kai-Ming Chang, New Taipei (TW); Chih-Chia Chang, Hsinchu County (TW); Ting-Hsun Cheng, Chiayi County (TW)

(73) Assignees: Industrial Technology Research Institute, Hsinchu (TW); Intellectual Property Innovation Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/729,520

(22) Filed: Dec. 30, 2019

(65) Prior Publication Data

US 2020/0130324 A1 Apr. 30, 2020

Related U.S. Application Data

(63) Continuation-in-part of application No. 16/039,366, filed on Jul. 19, 2018.

(Continued)

(30) Foreign Application Priority Data

Dec. 28, 2017 (TW) .................................. 106146308

(51) Int. Cl.
G02B 1/14 (2015.01)
B32B 7/12 (2006.01)
H01L 23/00 (2006.01)

(52) U.S. Cl.
CPC .................. *B32B 7/12* (2013.01); *G02B 1/14* (2015.01); *B32B 2307/558* (2013.01);
(Continued)

(58) Field of Classification Search
CPC ................................ G02B 1/14; H01L 23/562
See application file for complete search history.

(56) References Cited

U.S. PATENT DOCUMENTS

2014/0131852 A1 5/2014 Eguchi
2017/0179434 A1 6/2017 Chang et al.

OTHER PUBLICATIONS

"Office Action of Taiwan Counterpart Application," dated Jan. 6, 2020, p. 1-p. 8.

*Primary Examiner* — William P Watkins, III
(74) *Attorney, Agent, or Firm* — JCIPRNET

(57) ABSTRACT

An impact resistant structure for an electronic component. The impact resistant structure includes a resistance stack layer and a damping laminate. The resistance stack layer is disposed on a first surface of the electronic component, a thickness of the resistance stack layer is less than 10 μm, and a Young's modulus of the resistance stack layer is between 40 GPa and 150 GPa. The damping laminate is disposed on a second surface of the electronic component. The second surface of the electronic component is opposite to the first surface. The damping laminate includes a soft film and a support film, where the support film is disposed between the soft film and the electronic component.

20 Claims, 11 Drawing Sheets

Related U.S. Application Data

(60) Provisional application No. 62/544,921, filed on Aug. 14, 2017.

(52) U.S. Cl.
CPC ..... *B32B 2307/584* (2013.01); *B32B 2457/00* (2013.01); *H01L 23/562* (2013.01)

US 11,007,751 B2

IMPACT RESISTANT STRUCTURE AND ELECTRONIC DEVICE

CROSS-REFERENCE TO RELATED APPLICATION

This application is a continuation-in-part application of and claims the priority benefit of U.S. application Ser. No. 16/039,336, filed on Jul. 19, 2018, now pending, which claims the priority benefits of U.S. provisional application Ser. No. 62/544,921, filed on Aug. 14, 2017 and Taiwan application serial no. 106146308, filed on Dec. 28, 2017. The entirety of each of the above-mentioned patent applications is hereby incorporated by reference herein and made a part of this specification.

BACKGROUND OF THE DISCLOSURE

Technical Field

The disclosure relates to an impact resistant structure and an electronic device.

Description of Related Art

After electronic component (for example, flexible electronic component, flexible SiP) is lighted and thinned, its own mechanical strength and hardness are inadequate, and it is easily scratched, worn by an external force to cause damage in manufacture, handling and use, so that component reliability is decreased.

SUMMARY

An embodiment of the disclosure provides an impact resistant structure adapted to an electronic component. The impact resistant structure includes a resistance stack layer and a damping laminate. The resistance stack layer is disposed on a first surface of the electronic component, and the damping laminate is disposed on a second surface of the electronic component. The second surface of the electronic component is opposite to the first surface. A thickness of the resistance stack layer is less than 10 μm, and a Young's modulus of the resistance stack layer is between 40 GPa and 150 GPa. The damping laminate is disposed on a second surface of the electronic component. The damping laminate includes a soft film and a support film. The support film is disposed between the soft film and the electronic component.

Another embodiment of the disclosure provides an impact resistant structure for an electronic component. The impact resistant structure includes a resistance stack layer and a damping laminate. The resistance stack layer is disposed on a first surface of the electronic component, and the damping laminate is disposed on a second surface of the electronic component. The second surface of the electronic component is opposite to the first surface. A thickness ratio of the resistance stack layer to the electronic component is between 0.02 and 6, and a Young's modulus ratio of the resistance stack layer to the electronic component is between 0.57 and 5. The damping laminate is disposed on a second surface of the electronic component. The damping laminate includes a soft film and a support film. The support film is disposed between the soft film and the electronic component.

Another embodiment of the disclosure provides an electronic device including an electronic component and the aforementioned impact resistant structure disposed on the electronic component.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
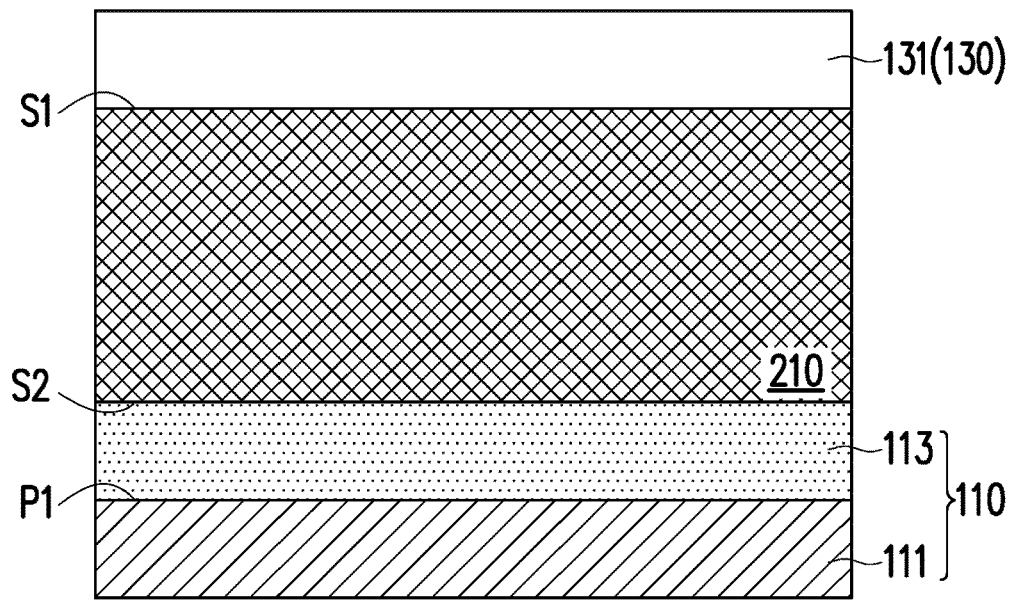
FIG. 1A, FIG. 1B, FIG. 2A, FIG. 2B, FIG. 3, FIG. 4, FIG. 6A to FIG. 6C, FIG. 7 to FIG. 10, FIG. 11A, FIG. 12, and FIG. 13B are cross-sectional views of an electronic device having an impact resistant structure according to embodiments of the disclosure.

Reference will now be made in detail to the present embodiments of the disclosure, examples of which are illustrated in the accompanying drawings. Wherever possible, the same reference numbers are used in the drawings and the description to refer to the same or like parts. Moreover, it should be noticed that in the figures, some parts are emphasized for easy understanding and are not necessarily drawn to scale.

Embodiments of the disclosure provide several impact resistant structures. Theses impact resistant structures may be formed on an electronic component, or adhered on the electronic component (for example, flexible electronic component), so as to reduce the damage of the electronic component when the electronic component is scratched by a sharp object or impact or pressed, and improve reliability of electronic products. A following Young's modulus may be obtained through nanoindentation or microstretching. When the material may not singly form a film, nanoindentation is the main method, or the Young's modulus is obtained through stretching conversion of composite laminated material.

FIG. 1A is a cross-sectional view of an electronic device having an impact resistant structure according to an embodiment of the disclosure.

Referring to FIG. 1A, the impact resistant structure 10a1 of the present embodiment is disposed on a first surface S1 and a second surface S2 of an electronic component 210. The first surface S1 and the second surface S2 of the electronic component 210 are opposite to each other. The electronic component 210 may be a wire, an electrode, a resistor, an inductor, a capacitor, a transistor, a diode, a switch element, an amplifier, a processor, a controller, a thin-film transistor, a touch element, a pressure sensing element, a microelectromechanical element, a feedback element, a display (OLED or Micro-LED), or other proper electronic component. In some embodiments, the electronic component 210 may be a screen of a consumable electronic product. A range of a Young's modulus of the electronic component 210 ($Y_{device}$) is, for example, between 10 GPa and 100 GPa. A thickness of the electronic component 210 ($L_{device}$) is, for example, between 30 μm and 150 μm.

Figure 13A:
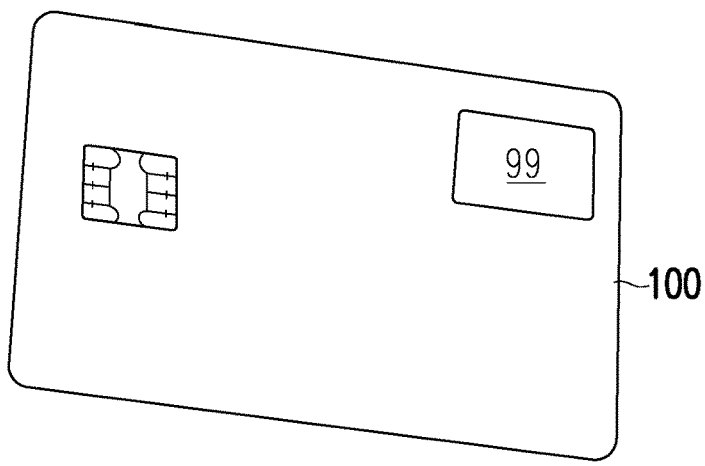
FIG. 13A is a top view of an electronic component according to an embodiment of the disclosure.
Figure 13B:
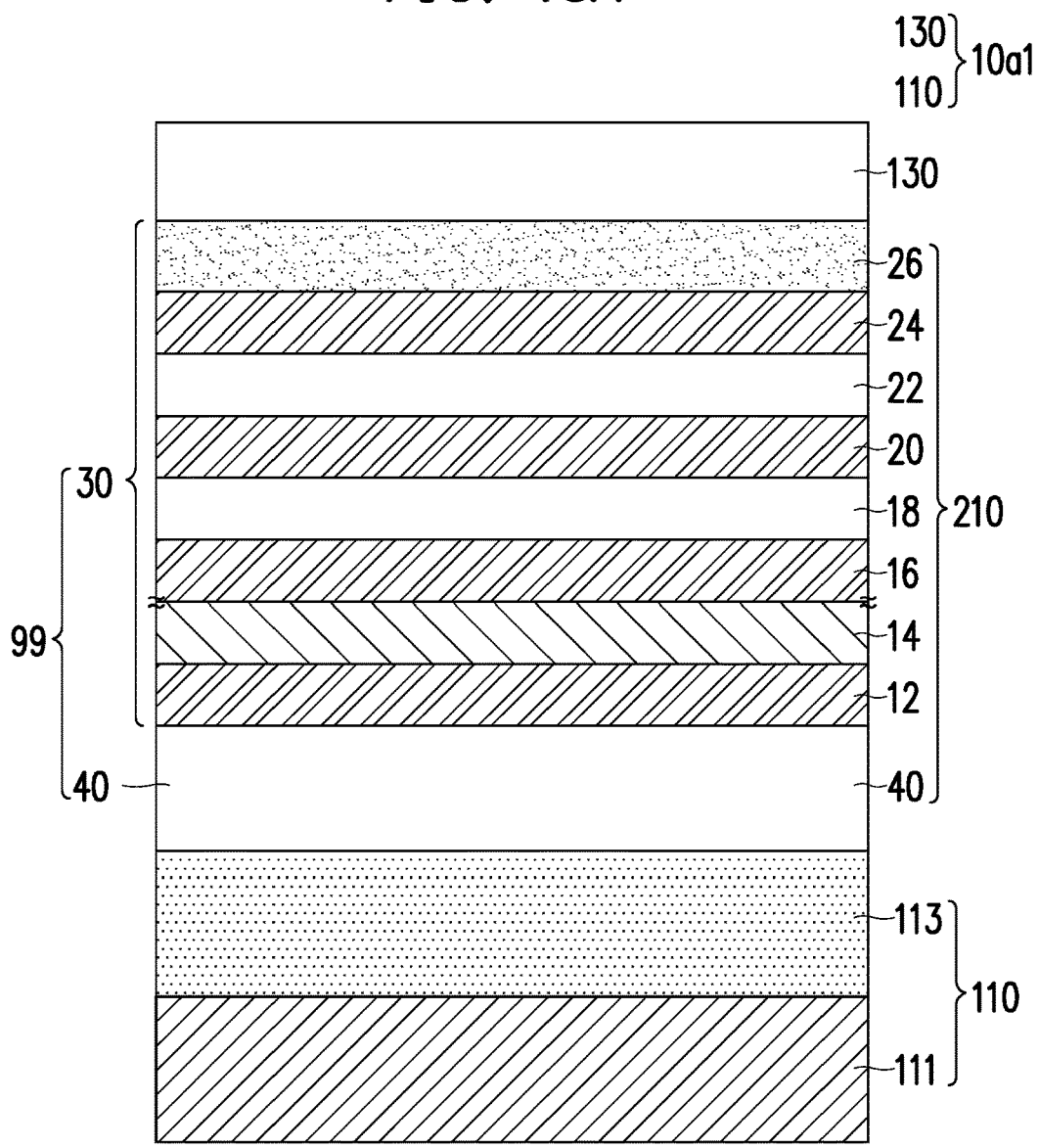

Referring to FIGS. 13A and 13B, in alternative embodiments, the electronic component 210 may be a sensor, for example, a flexible fingerprint sensor 99 on a payment 100 such as a payment card. The flexible fingerprint sensor 99 may be a flexible thin-film transistor (TFT) backplane. The flexible TFT backplane may include a stacked structure formed by, for example, a substrate 40 and a TFT layer 30. The TFT layer 30 includes a buffer layer 12, a polysilicon layer 14, a first metal layer 16, a first interlayer dielectric (ILD) layer 18, a second metal layer 20, a second ILD layer 22, a third metal layer 24, and a passivation layer 26 from the bottom to the top. However, the structure of the flexible fingerprint sensor 99 is not limited thereto, and the flexible fingerprint sensor 99 may include more layers or fewer layers. The dimension of the flexible fingerprint sensor 99 is, for example, 19.00 mm×54.05 mm×0.470 mm, and the dimension of the active area of the flexible fingerprint sensor 99 is, for example, 11.9 mm×16.9 mm. A Young's modulus of the electronic component 210 ($Y_{device}$) is, for example, between 30 GPa and 70 GPa. A thickness ($L_{device}$) of the electronic component 210 is, for example, between 0.5 μm and 30 μm.

In an embodiment in which the electronic component 210 is the flexible fingerprint sensor 99, the resistance stack layer 130 is formed on the passivation layer 26. A Young's modulus ($Y_r$) of the resistance stack layer 130 is, for example, between 40 GPa and 150 GPa. A Young's modulus ratio ($Y_r/Y_{device}$) of the resistance stack layer 130 to the electronic component 210 is, for example, between 0.57 and 5. A thickness (Lr) of the resistance stack layer 130 is, for example, between 0.1 μm and 10 μm. A thickness ratio ($L_r/L_{device}$) of the resistance stack layer 130 to the electronic component 210 is, for example, between 0.02 and 6.

The resistance stack layer 130 includes polyimide (PI), poly (methyl methacrylate) (PMMA), polycarbonate (PC), polyethersulfone (PES), polyimide (PA), poly (ethylene terephthalate) (PET), polyetheretherketone (PEEK), polyethylene naphthalate (PEN), polyethylenimine (PEI), polyurethane (PU), polydimethylsiloxane (PDMS), acrylic, ether series of polymers, polyolefin, amorphous carbon material, diamond-like carbon (DLC), or a combination thereof, but not limited thereto. A method for forming the support film 113 includes coating, printing sputtering, chemical vapor deposition, or a combination thereof.

In an embodiment in which the electronic component 210 is the flexible fingerprint sensor 99, the soft film 111 is formed below the substrate 40. A Young's modulus ($Y_{soft}$) of the soft film 111 of the damping laminate 110 is, for example, between 0.001 GPa and 3 GPa. A material of the soft film 111 may include silicone, rubber, acrylonitrile butadiene styrene resin, polyethylenimine (PEI), polyurethane (PU), an adhesive, a filler, thermoplastic urethane (TPU) or a combination thereof. A thickness ($L_{soft}$) of the soft film is, for example, between 30 μm and 1000 μm.

In an embodiment, in which the electronic component 210 is the flexible fingerprint sensor 99, the support film 113 is formed between the substrate 40 and the soft film 111. A Young's modulus ($Y_{support}$) of the support film 113 is, for example, between 2 GPa and 150 GPa. A material of the support film 113 includes poly (methyl methacrylate) (PMMA), polycarbonate (PC), polyethersulfone (PES), polyamide (PA), poly (ethylene terephthalate) (PET), polyetheretherketone (PEEK), polyethylene naphthalate (PEN), polyethylenimine (PEI), polyurethane (PU), polydimethylsiloxane (PDMS), acrylic, ether series of polymers, polyolefin, metal, glass, fiber composition, or a combination thereof. A thickness ($L_{support}$) of the support film 113 is, for example, between 30 μm and 500 μm.

A Young's modulus ratio ($Y_{soft}/Y_{support}$) of the soft film 111 to the support film 113 is, for example, between 6.6× $10^{-7}$ and 1.5. A thickness ratio ($L_{soft}/L_{support}$) of the soft film 111 to the support film 113 is, for example, between 1 and 33.33. A Young's modulus ratio ($Y_{device}/Y_{damping}$) of the electronic component 210 and the damping laminate 110 is, for example, between 0.2 and 3.5. A thickness ratio ($L_{device}/L_{clamping}$) of the electronic component 210 to the damping laminate 110 is, for example, between 0.001 and 0.96.

Referring to FIG. 1A, the impact resistant structure 10a1 includes a damping laminate 110 and a resistance stack layer 130. The resistance stack layer 130 is disposed on the first surface S1 of the electronic component 210. In some embodiments, the first surface S1 may be a light source outputting surface of the electronic component 210, or a user clicking area. The resistance stack layer 130 has an anti-scratch function and an anti-impact function, and may reduce a damage of the electronic component 210 when the surface thereof is scratched by a sharp object or impacted. A Young's modulus ($Y_r$) of the resistance stack layer 130 is, for example, between 1 GPa and 60 GPa. In some embodiments, a range of the Young's modulus of the resistance stack layer 130 is, for example, between 1 GPa and 40 GPa. In some other embodiments, the range of the Young's modulus of the resistance stack layer 130 is, for example, between 1 GPa and 30 GPa. On the other hand, a range of a Young's modulus ratio ($Y_{device}/Y_r$) of the electronic component 210 and the resistance stack layer 130 is, for example, between 0.16 and 100. In some embodiments, the range of the Young's modulus ratio ($Y_{device}/Y_r$) is, for example, between 0.25 and 100. In some other embodiments, the range of the Young's modulus ratio ($Y_{device}/Y_r$) is, for example, between 0.33 and 100. A method for forming the resistance stack layer 130 includes coating, printing or a combination thereof. A thickness ($L_r$) of the resistance stack layer 130 is, for example, between 10 μm and 100 μm. In other words, a range of a ratio ($L_{device}/L_r$) of the thickness of the electronic component 210 and the thickness of the resistance stack layer 130 is, for example, between 0.3 and 15.

In some embodiments, the resistance stack layer 130 may be a flexible substrate or a scratch resistant wear protective layer 131. In some embodiments, the scratch resistant wear protective layer 131 refers to as a plastic window. In the following description, for simplicity's sake, the scratch resistant wear protective layer is regarded as an example for description, though the disclosure is not limited thereto, and the resistance stack layer 130 may be a single layer structure, a double layer structure or a multi-layer structure.

In some embodiments, the resistance stack layer 130 includes an organic material or polymer. The organic material is, for example, one of polyimide (PI), poly(methyl methacrylate) (PMMA), polycarbonate (PC), polyethersulfone (PES), polyimide (PA), poly(ethylene terephthalate) (PET), polyetheretherketone (PEEK), polyethylene naphthalate (PEN), polyethylenimine (PEI), polyurethane (PU), polydimethylsiloxane (PDMS), acrylic, ether series of polymers, polyolefin or a combination of two or more of the above materials, though the disclosure is not limited thereto. In other words, the resistance stack layer 130 may be a single organic material, a mixture of two organic materials or a mixture of multiple organic materials.

In some other embodiments, the resistance stack layer 130 is made of a composite material. The resistance stack layer 130 includes an organic material and an inorganic material. The configuration of the inorganic material has many ways to distribute in the organic material by means of dots, stripes, networks, three-dimensional networks, or a combination thereof. The organic material is described as above. Adding of the inorganic material may improve impact resistance capability of the impact resistant structure. The inorganic material may be silica, aluminum oxide, titanic oxide or a combination thereof, though the disclosure is not limited thereto. In the embodiment that the resistance stack layer 130 is made of the composite material (including the organic material and the inorganic material) and the inorganic material is silica, through dispersion reaction treatment of surface functional groups of the silica, the inorganic material may have a cross-linking reaction to form a reticular structure, so as to improve a compressive strength thereof. In some embodiment, the dispersion reaction treatment is to use catalyst to make the surface functional groups of the inorganic material to produce the cross-linking reaction. In some embodiments, the catalyst may be acidic or alkaline. The acidic catalyst is, for example, HCl, $H_2SO_4$, $HNO_3$ and propenoic acid (or referred as acrylic acid). The alkaline catalyst is, for example, NaOH and $NH_4OH$. Proper catalyst is applied according to different functional requirements, and in case of the acidic catalyst, a hydrolysis rate thereof is greater than a condensation rate, which is liable to form the network structure.

Referring to FIG. 1A, the damping laminate 110 of the impact resistant structure 10a1 is disposed on the second surface S2 of the electronic component 210. The second surface S2 may be another side opposite to the light source outputting surface of the electronic component 210, or another side opposite to the user clicking area. The damping laminate 110 has a function of buffering impact. When the electronic component 210 is impacted, the damping laminate 110 may buffer the direct impact or secondary rebound impact. The damping laminate 110 may include a soft material and a hard material. In some embodiments, the damping laminate 110 includes a soft film 111 and a support film 113. The support film 113 is disposed between the soft film 111 and the electronic component 210.

The soft film 111 of the damping laminate 110 is a soft material. In other words, a Young's modulus of the soft film 111 is smaller than a Young's modulus of the support film 113. A Young's modulus range ($Y_{soft}$) of the soft film 111 is, for example, between 0.001 GPa and 1 GPa. The preferred Young's modulus range ($Y_{soft}$) of the soft film 111 is, for example, between 0.05 GPa and 1 GPa. A material of the soft film 111 may be an organic material (or referred as a polymer), for example, rubber, butadiene acrylonitrile or a combination thereof. The material of the soft film 111 may also be an inorganic material, for example, silicone. A method of forming the soft film 111 is, for example, coating, printing, sputtering, chemical vapor deposition or a combination thereof. In some other embodiments, the soft film 111 may further be a composite material layer composed of the aforementioned organic material and the aforementioned inorganic material. A range of Young's modulus ratio ($Y_{device}/Y_{soft}$) of the electronic component 210 and the soft film 111 is, for example, between 10 and 100000. A range of a thickness $L_{soft}$ of the soft film 111 is, for example, between 500 μm and 3000 μm.

Referring to FIG. 1A, the support film 113 of the damping laminate 110 is a material that is not easily deformed, and is adapted to provide support to the soft film 111. In other words, the Young's modulus of the support film 113 is higher than the Young's modulus of the soft film 111. A range of the Young's modulus ($Y_{support}$) of the support film 113 is, for example, between 50 GPa and 300 GPa. In some embodiments, the range of the Young's modulus of the support film 113 is, for example, between 50 GPa and 250 GPa. In some other embodiments, the range of the Young's modulus of the support film 113 is, for example, between 50 GPa and 220 GPa. A material of the support film 113 may be a polymer, for example, PMMA. In some embodiments, the material of the support film 113 may be an inorganic material, for example, metal, glass, stainless steel or a combination thereof, etc. In some other embodiments, the support film 113 may be a composite material layer composed of the aforementioned organic material and the aforementioned inorganic material. A range of a ratio between the Young's modulus of the electronic component 210 and the Young's modulus of the support film 113 ($Y_{device}/Y_{support}$) is, for example, between 0.03 and 2. In some embodiments, the range of the Young's modulus ratio ($Y_{device}/Y_{support}$) of the electronic component 210 and the support film 113 is, for example, between 0.04 and 2. In some other embodiments, the range of the Young's modulus ratio ($Y_{device}/Y_{support}$) of the electronic component 210 and the support film 113 is, for example, between 0.045 and 2. A method for forming the support film 113 includes coating, printing sputtering, chemical vapor deposition or a combination thereof. A thickness ($L_{support}$) of the support film 113 is, for example, between 30 μm and 1000 μm. A range of a ratio of a thickness of the electronic component 210 and the thickness of the support film 113 ($L_{device}/L_{support}$) is, for example, between 0.03 and 5. In some embodiment, a range of a ratio of the thicknesses ($L_{soft}/L_{support}$) of the soft film 111 and the support film 113 is, for example, between 0.2 and 30.

Referring to FIG. 1A, in some embodiment, the impact resistant structure 10a1 may be adhered to the electronic component 210 through adhesive layers (not shown), where the adhesive layers are respectively disposed between the resistance stack layer 130 and the electronic component 210, and between the damping laminate 110 and the electronic component 210. A material of the adhesive layers is, for example, a resin film, an optical transparent adhesive (OCA), a hot melt adhesive, an optical pressure sensitive adhesive (PSA), an optical pressure sensitive resin (OCR) or a combination thereof, thought the disclosure is not limited thereto.

Figure 1B:
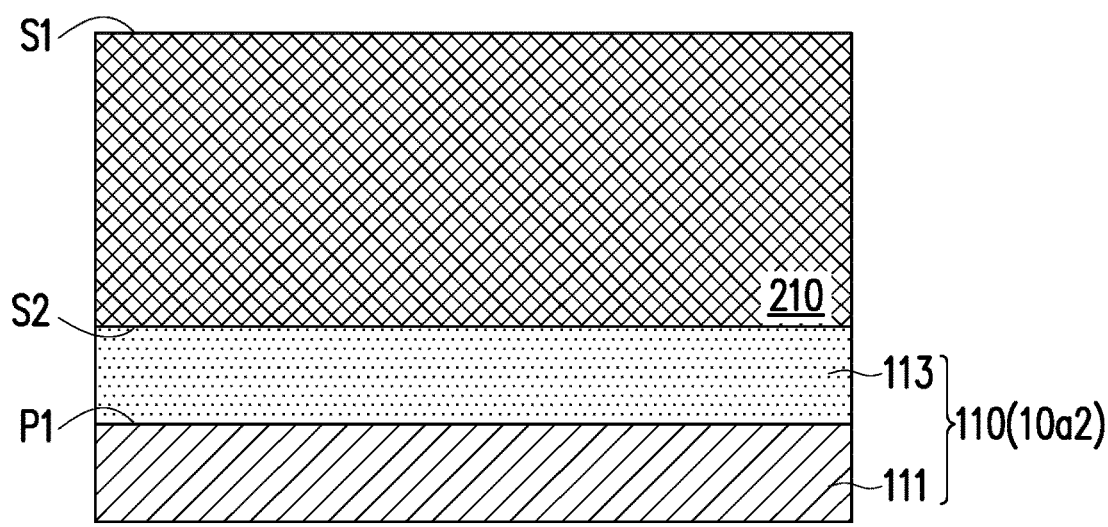

Referring to FIG. 1B, in some other embodiments, an impact resistant structure 10a2 is similar to the impact resistant structure 10a1, and a difference there between is that the impact resistant structure 10a2 includes the damping laminate 110 but does not include the resistance stack layer 130, and detail thereof is not repeated.

Figure 2A:
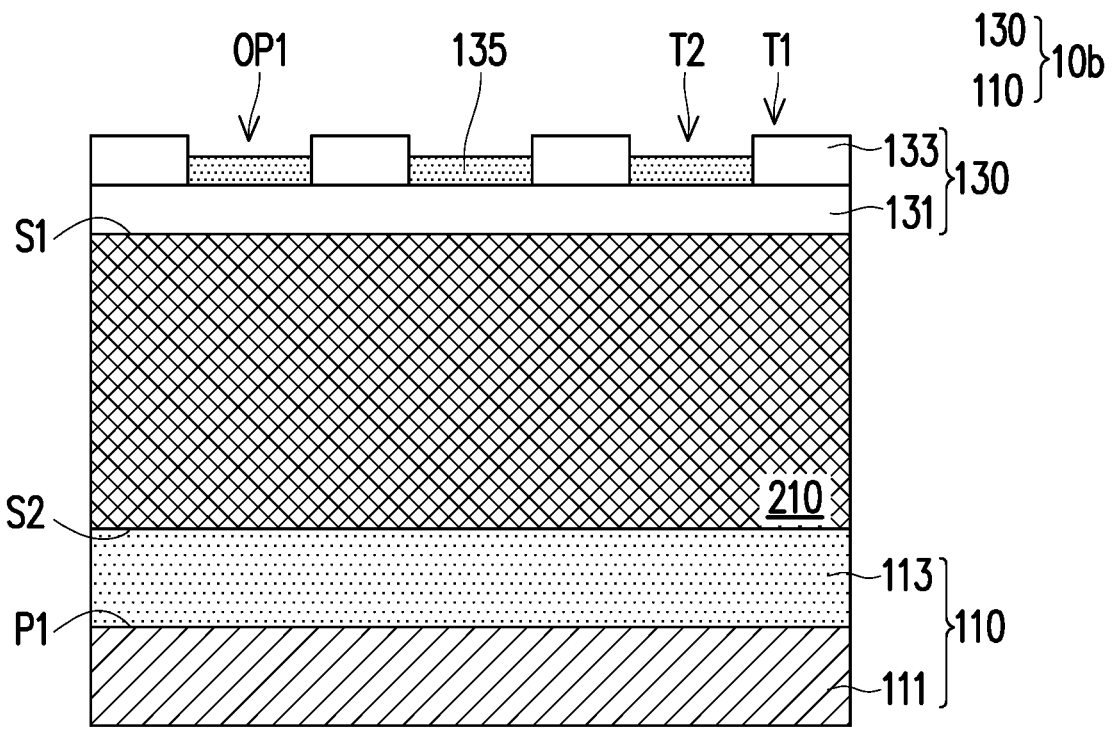
Figure 2B:
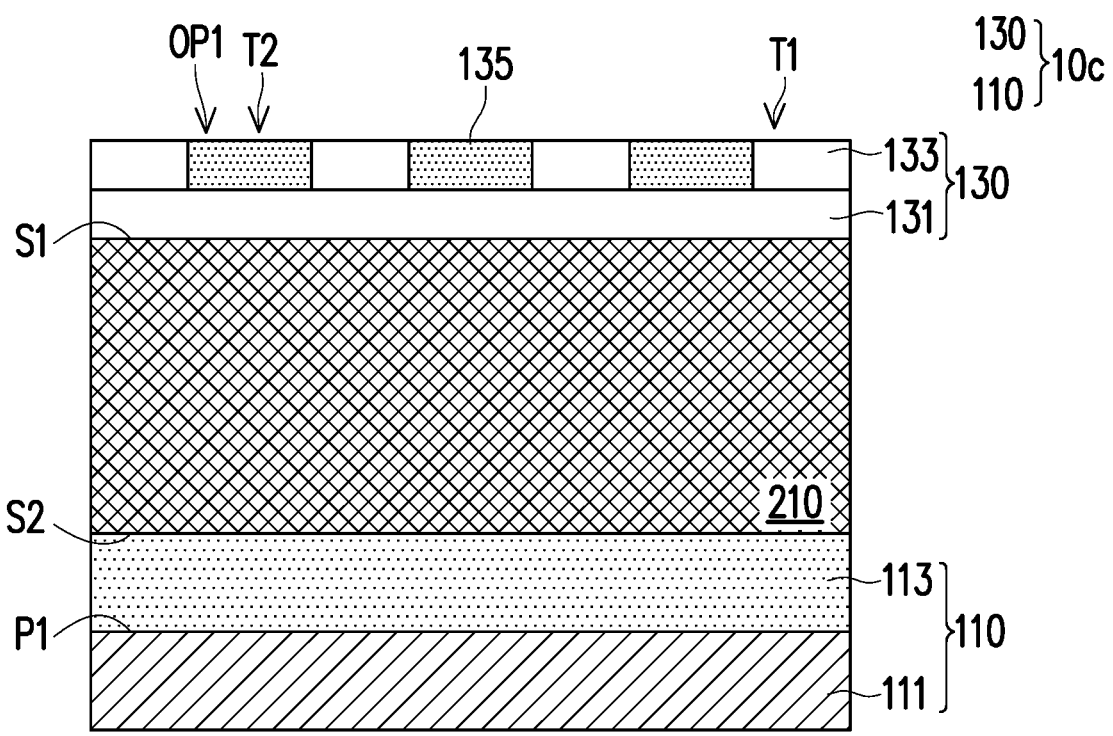

FIG. 2A to FIG. 2B are cross-sectional views of an electronic device having an impact resistant structure according to an embodiment of the disclosure.

In some embodiments, the impact resistant structures 10b and 10c are similar to the aforementioned impact resistant structure 10a1, though besides including the scratch resistant wear protective layer 131, the resistance stack layer 130 also includes a hard coating layer 133. The hard coating layer 133 is disposed on the scratch resistant wear protective layer 131. In some embodiments, the hard coating layer 133 is a non-patterned layer (not shown), and completely covers the scratch resistant wear protective layer 131. In some embodiments the hard coating layer 133 is a patterned layer (shown in FIG. 2A and FIG. 2B).

Referring to FIG. 2A and FIG. 2B, the resistance stack layer 130 includes the scratch resistant wear protective layer 131, the hard coating layer 133 and a soft material 135. The hard coating layer 133 is a patterned layer and has a plurality of openings OP1 to expose a top surface of the scratch resistant wear protective layer 131. The soft material 135 is disposed in the plurality of openings OP1 to cover the bottoms of the openings OP1. A Young's modulus of the soft material 135 is lower than or equal to a Young's modulus of the hard coating layer 133. In case of impact, the rigid hard coating layer 133 maintains a structure of the impact resistant structure 10b or 10c to be unchanged, and the softer soft material 135 may cushion a stress caused by the impact. In some embodiments, a range of the Young's modulus ($Y_{hard}$) of the hard coating layer 133 is, for example, between 10 GPa and 30 GPa; and a range of the Young's modulus ($Y_{soft}$) of the soft material 135 is, for example, between 1 GPa and 30 GPa. A material of the hard coating layer 133 may be an inorganic material, for example, diamond-like carbon, silicon nitride, or a combination thereof. In some other embodiments, the material of the hard coating layer 133 may also be an organic material (or referred as polymer), for example, pentaerythritol trimethacrylate, acrylic material or a combination thereof. In some embodiments, the hard coating layer 133 may further be a composite material layer composed of the aforementioned organic material and the aforementioned inorganic material. In some embodiments, the hard coating layer 133 may be formed through sputtering, evaporation, chemical vapor deposition and physical vapor deposition, etc. Then, the hard coating layer 133 is patterned through a photolithography and etching process to form the plurality of openings OP1. A material of the soft material 135 may be an organic material (or referred to as polymer), for example, hexamethyldisilazane (HMDS), propylene glycol methyl ether acetate (PGMEA), acrylic resin, trimethoxysilane, PMMA, methacryloxy propyl trimethoxyl silane, styrene copolymer (MS), cellulose acetate (CA), polymer of acrylic series, silane or a combination thereof, though the disclosure is not limited thereto. The soft material 135 may be filled into the openings OP1 through coating, printing or a combination thereof.

Referring to FIG. 2A, in some embodiments, a first top surface T1 of the hard coating layer 133 of the impact resistant structure 10b is higher than or equal to a second top surface T2 of the soft material 135. In other words, the first top surface T1 of the hard coating layer 133 and the second top surface T2 of the soft material 135 form a concave and convex shape. In some embodiments, a thickness ($L_{hard}$) of the hard coating layer 133 is, for example, between 5 μm and 35 μm; and a thickness ($L_{soft}$) of the soft material 135 is, for example, between 1 μm and 35 μm.

Referring to FIG. 2B, in some embodiments, the second top surface T2 of the soft material 135 in the impact resistant structure 10c may be aligned with the first top surface T1 of the hard coating layer 133. In other words, the second top surface T2 of the soft material 135 may be coplanar with the first top surface T1 of the hard coating layer 133. The thickness ($L_{hard}$) of the hard coating layer 133 and the thickness of the soft material 135 are, for example, 5 μm to 35 μm.

Figure 3:
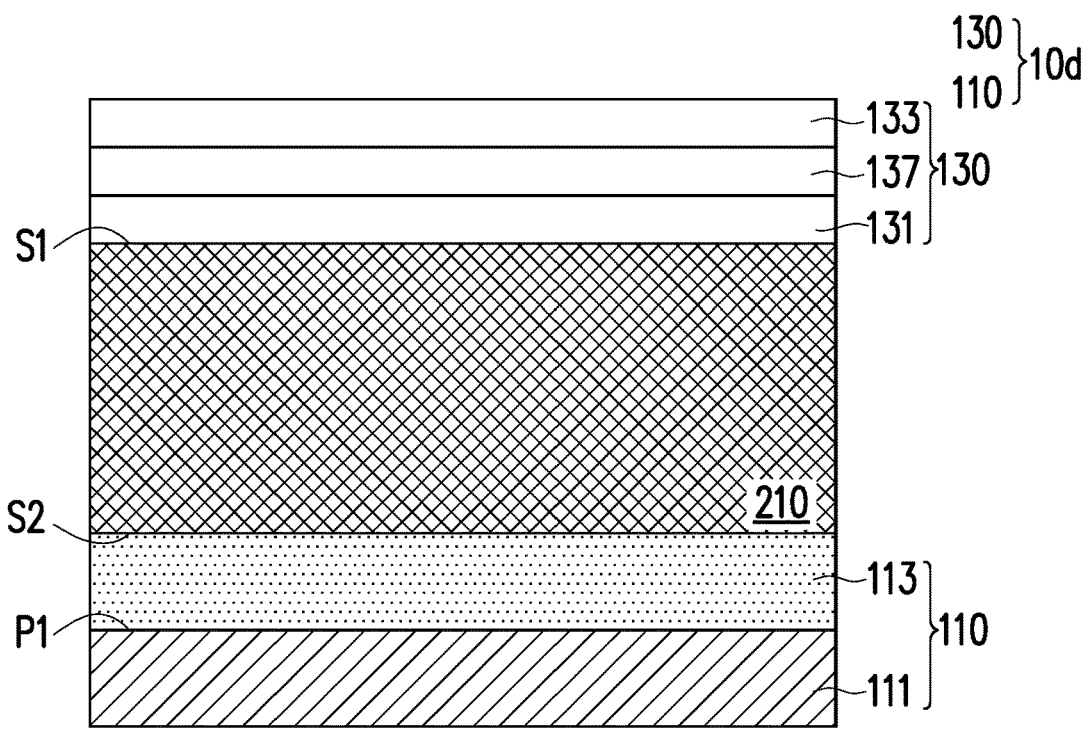

FIG. 3 is a cross-sectional view of an electronic device having the impact resistant structure according to an embodiment of the disclosure.

Referring to FIG. 3, the impact resistant structure 10d includes the aforementioned damping laminate 110 and the resistance stack layer 130. The resistance stack layer 130 of the present embodiment includes the scratch resistant wear protective layer 131, the hard coating layer 133 and a hard support layer 137. The hard support layer 137 is disposed between the hard coating layer 133 and the scratch resistant wear protective layer 131. The hard support layer 137 may mitigate surface cracking of the hard coating layer 133 when the hard coating layer 133 is impacted by a foreign object. A range of a Young's modulus ($Y_{hard\ support}$) of the hard support layer 137 is, for example, between 10 GPa and 100 GPa. In some embodiments, the range of the Young's modulus of the hard support layer 137 is, for example, between 20 GPa and 80 GPa. In some other embodiments, the range of the Young's modulus of the hard support layer 137 is, for example, between 40 GPa and 60 GPa. A Young's modulus ratio ($Y_{hard\ support}/Y_{hard}$) of the hard support layer 137 and the hard coating layer 133 is, for example, 0.3 to 10. In some other embodiments, the range of the Young's modulus ratio ($Y_{hard\ support}/Y_{hard}$) is, for example, 0.67 to 8.

In some embodiments, the range of the Young's modulus ratio ($Y_{hard\ support}/Y_{hard}$) is, for example, 6 to 1.33. A thickness ($L_{hard\ support}$) of the hard support layer 137 is smaller than a thickness of the hard coating layer 133. In some embodiments, the thickness ($L_{hard\ support}$) of the hard support layer 137 is smaller than 0.8 μm. A ratio between the thickness of the hard support layer 137 and the thickness ($L_{hard}$) of the hard coating layer 133 ($L_{hard\ support}/L_{hard}$) is 0.02 to 0.17.

A range of the Young's modulus of the scratch resistant wear protective layer 131 ($Y_{plastic}$) is, for example, 1 GPa to 20 GPa. A Young's modulus ratio ($Y_{hard\ support}/Y_{plastic}$) of the hard support layer 137 and the scratch resistant wear protective layer 131 is, for example, 0.5 to 100. In some embodiments, the range of the Young's modulus ratio ($Y_{hard\ support}/Y_{plastic}$) is, for example, 1 to 80. In some other embodiments, the range of the Young's modulus ratio ($Y_{hard\ support}/Y_{plastic}$) is, for example, 2 to 60. The thickness ($L_{hard\ support}$) of the hard support layer 137 is smaller than the thickness of the scratch resistant wear protective layer 131. In some embodiments, the thickness ($L_{plastic}$) of the scratch resistant wear protective layer 131 is, for example, 5 μm to 50 μm. A ratio between the thickness of the hard support layer 137 and the thickness of the scratch resistant wear protective layer 131 ($L_{hard\ support}/L_{plastic}$) is 0.02 to 0.17.

The hard support layer 137 may be made of an inorganic material, for example, a single metal (or referred as an elemental metal), a metal oxide, a non-metal oxide, a non-metal nitride, a ceramic material, or a composite material composed of a single one or two or more of the aforementioned materials. Further, the hard support layer 137 is, for example, made of diamond-like carbon (DLC), silicon nitride, silicon oxide, silica, silicon oxynitride, aluminium oxide, aluminium titanium dioxide, sapphire coating, titanium oxynitride, a solution coated gas barrier (SGB) material, or a combination thereof. A method of producing the hard support layer 137 includes sputtering, vaporation, chemical vapor deposition, physical vapor deposition, or a combination thereof.

Figure 4:
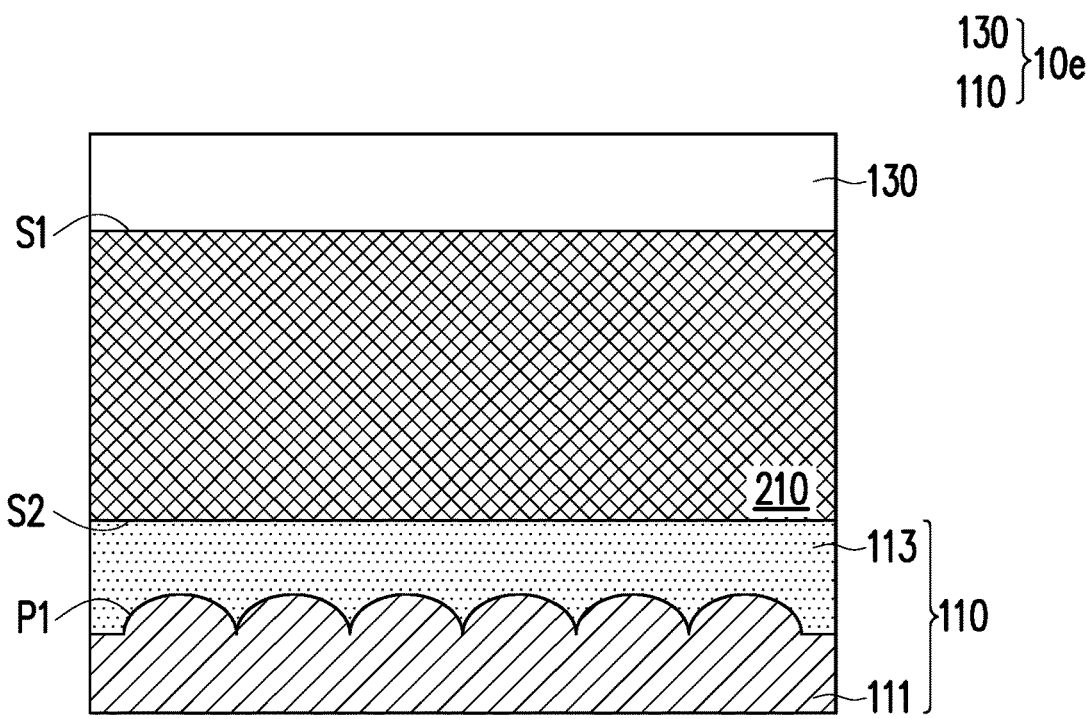

FIG. 4 is a cross-sectional view of an impact resistant structure having an electronic component according to an embodiment of the disclosure.

Referring to FIG. 4, the impact resistant structure 10e includes the damping laminate 110 and the aforementioned resistance stack layer 130. The damping laminate 110 includes the soft film 111 and the support film 113. In the aforementioned embodiments, an interface P1 between the soft film 111 and the support film 113 is a flat plane, i.e. the interfaces of the aforementioned embodiments respectively present a straight line (for example, P1 of FIG. 1A) in the respective cross-sectional views. In the present embodiment, the interface P1 between the soft film 111 and the support film 113 is a non-flat plane, and is, for example, a geometric curved plane. Namely, in the cross-sectional view (FIG. 4) of the impact resistant structure 10e, the interface P1 may be an arc line, a continuous arc line, a fold line, a wave line, a concave and convex shape or a combination thereof. Geometric variations of a lower surface of the support film 113 and a top surface of the soft film 111 correspond to each other at the interface P1. Namely, the lower surface of the support film 113 and the top surface of the soft film 111 are complementary at the interface P1, and are sealed without a gap. The interface P1 of the soft film 111 and the support film 113 is a non-flat plane, and is, for example, a geometric curved plane, which is adapted to improve a shear resistance capability between the support film 113 and the soft film 111.

Figure 5:
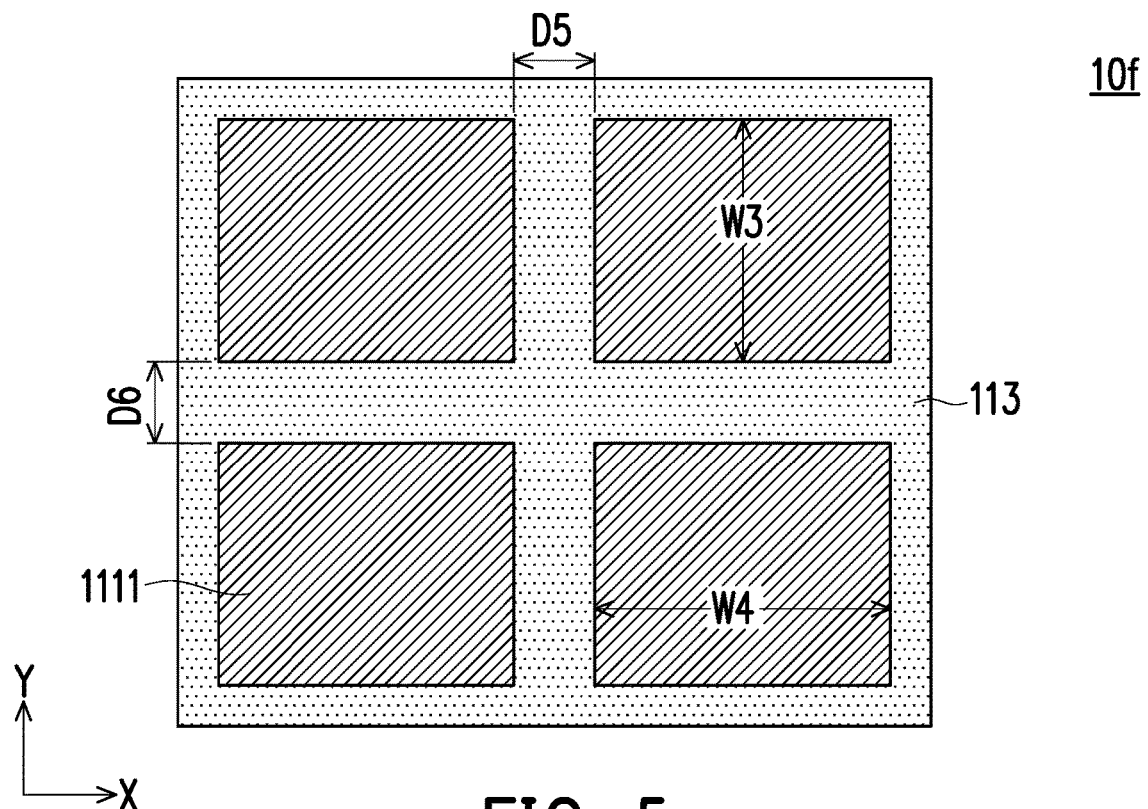
FIG. 5 is a top view of a damping laminate according to an embodiment of the disclosure.
Figure 6A:
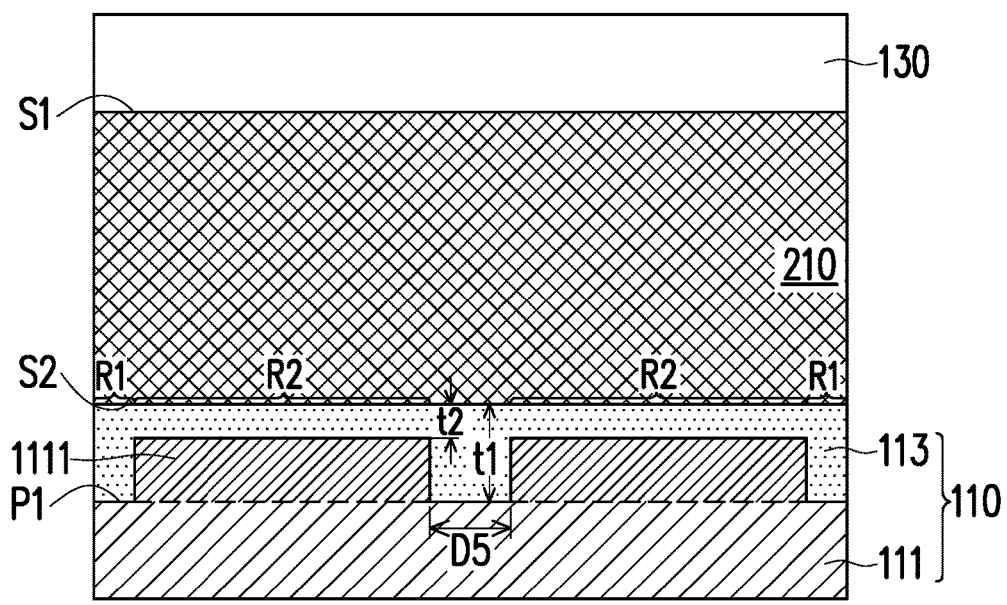
Figure 6B:
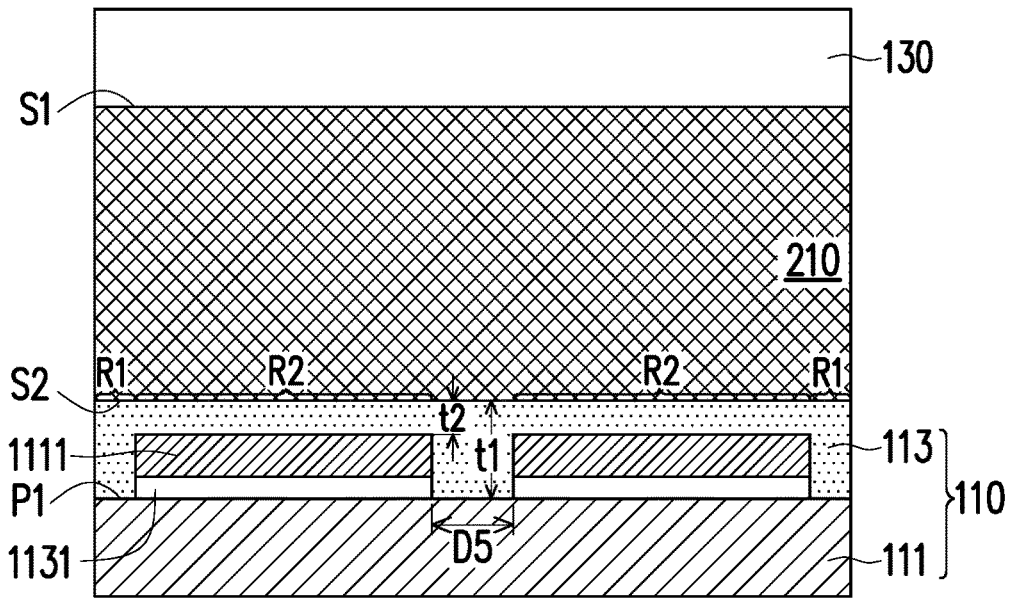
Figure 6C:
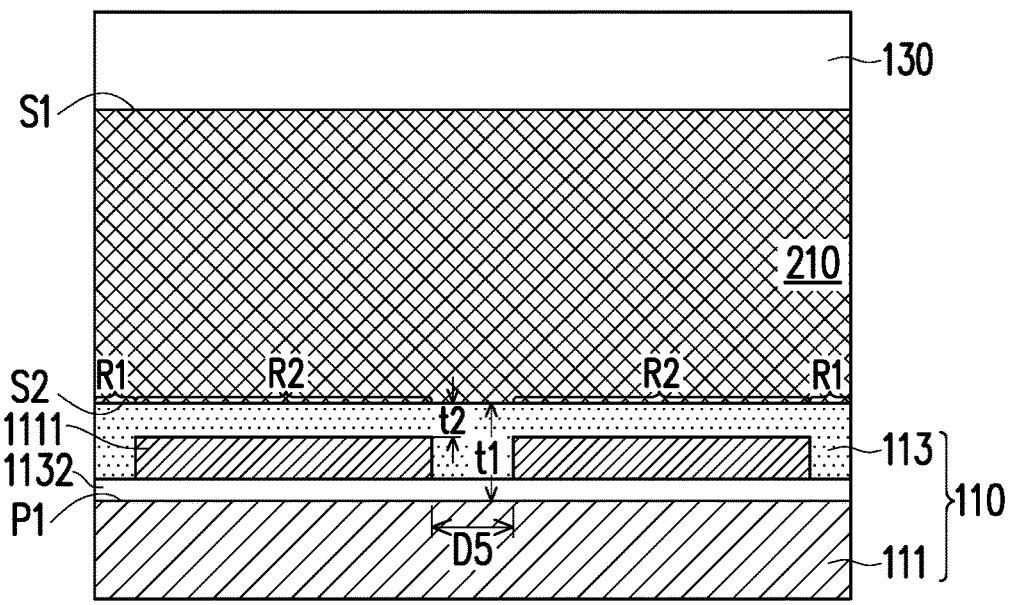

FIG. 5 is a top view of a damping laminate according to an embodiment of the disclosure. FIG. 6A to FIG. 6C are cross-sectional views of an electronic device having an impact resistant structure according to an embodiment of the disclosure.

In the aforementioned embodiments, the soft film and the support film are unpatterned films. However, in the present embodiment, the soft film and/or the support film may also be patterned films.

Referring to FIG. 5, the soft film 1111 and/or the support film 113 are patterned films. In the present embodiment, the support film 113 may have a grid-like configuration, and a plurality of block-like soft films 1111 is distributed in the grid-like support film 113 to enhance the shear resistance capability of the damping laminate. The block-like soft films 1111 may have irregular shapes or regular shapes. A shape of the block-like soft film 1111 is, for example, an arch, a rectangle, a round, an ellipse, a triangle, a polygon, a trapezium, or a combination thereof.

Referring to FIG. 5, in the embodiment that the block-like soft film 1111 is a rectangle, horizontal distances D5 between the soft films 1111 may be the same or different, and vertical distances D6 between the soft films 1111 may be the same or different. The horizontal distances D5 and the vertical distances D6 between the soft films 1111 may be the same or different. Widths W3 of the soft films 1111 may be the same or different, and widths W4 of the soft films 1111 may be the same or different. The horizontal widths W3 and the vertical widths W4 of each of the soft films 1111 may be the same or different. In some embodiments, the soft films 1111 may be arranged in an (m, n) array, where m is the number of the soft films 1111 in an x-direction, and n is the number of the soft films 1111 in a y-direction, and m and n are all positive integers, and m and n may be the same or different. A method for forming the soft film 1111 includes coating, printing or a combination thereof. The soft film 1111 and the support film 113 may be formed through various methods, which are described in detail below.

The impact resistant structure 10/1 of FIG. 6A is a first exemplary embodiment of the impact resistant structure 10f of FIG. 5. Referring to FIG. 6A, the impact resistant structure 10/1 includes the soft film 111, the soft film 1111 and the support film 113. The support film 113 is grid-like. In other words, the support film 113 includes a plurality of convex regions and a plurality of concave regions arranged in alternation to form a concave-convex structure. In detail, the support film 113 includes first regions R1 and second regions R2. The first regions R1 are convex regions, and the second regions R2 are concave regions. A thickness t1 of the first region R1 is greater than a thickness t2 of the second region R2. A ratio (t2/t1) between the thickness t2 of the second region R2 and the thickness t1 of the first region R1 is greater than 0.3 and less than 1.

A bottom surface of the first region R1 of the support film 113 contacts a top surface of the soft film 111, and a bottom surface of the second region R2 of the support film 113 contacts the soft film 1111. In other words, the soft films 1111 are embedded in the support film 113. Positions of the soft film 1111 correspond to positions of the second region R2. Sidewalls of the soft films 1111 contact the first regions R1 of the support film 113, and top surfaces of the soft films 1111 contact the second regions R2 of the support film 113. Bottom surfaces of the soft films 1111 contact the soft film 111. In other words, the interface P1 between the soft film 111, the soft film 1111 and the support film 113 is concave-convex like. A range of a thickness of the soft film 1111 is, for example, 20 μm to 350 μm. In some embodiments, the material of the soft film 1111 is the same to the material of the soft film 111. In some other embodiments, the material of the soft film 1111 is different to the material of the soft film 111. Namely, the Young's modulus of the soft film 1111 may be the same to the Young's modulus of the soft film 111. In some other embodiments, the Young's modulus of the soft film 1111 may be different to the Young's modulus of the soft film 111.

The impact resistant structure 10/2 of FIG. 6B is a second exemplary embodiment of the impact resistant structure 10f of FIG. 5. Referring to FIG. 6B, the impact resistant structure 10/2 is similar to the impact resistant structure 10/1 of FIG. 6A, and a difference there between is that the impact resistant structure 10/2 further includes a plurality of support films 1131. On the other hand, the support films 1131 and the soft films 1111 are embedded in the support film 113. The support films 1131 are disposed between the soft film 111 and the soft films 1111. In other words, a part of the soft film 111 contacts the support film 113, and the other part of the soft film 111 contacts the support films 1131. In the embodiment that the support film 113 is grid-like, the support films 1131 may be block-like. The block-like support films 1131 may have irregular shapes or regular shapes. The shape of the block-like support films 1131 is, for example, an arch, a rectangle, a round, an ellipse, a triangle, a polygon, a trapezium, or a combination thereof. In some embodiments, the support films 1131 and the soft films 1111 have the same shape and size. The material of the support films 1131 may be the same or different to the material of the support film 113. Namely, the Young's modulus of the support films 1131 may be the same of different to the Young's modulus of the support film 113. In some embodiments, the Young's modulus of the support films 1131 is greater than the Young's modulus of the soft films 1111, and greater than the Young's modulus of the soft film 111. From a longitudinal view, the damping laminate 110 disposed under the electronic component 210 includes the support film 113, the soft films 1111, the support films 1131 and the soft film 111 with alternated high, low, high, low Young's moduli. By using the support film 113, the soft films 1111, the support films 1131 and the soft film 111 with alternated high, low, high, low Young's moduli, good cushioning property is provided to the electronic component 210.

The impact resistant structure 10/3 of FIG. 6C is a third exemplary embodiment of the impact resistant structure 10f of FIG. 5. Referring to FIG. 6C, the impact resistant structure 10/3 is similar to the impact resistant structure 10/2 of FIG. 6B, and a difference there between is that the support film 1132 between the soft film 111 and the soft films 1111 and between the support film 113 and the soft film 111 is a continuous film. In other words, in the embodiment of FIG. 6B, the support films 1131 are discontinuous block-like structures, and in the embodiment of FIG. 6C, the support film 1132 is a continuous layer-like structure. The soft film 111 and the soft films 1111 and the support film 113 and the soft film 111 are all separated by the support film 1132. The material of the support film 1132 may be the same or different to the material of the support film 113. The material of the soft film 111 may be the same or different to the material of the soft films 1111. Namely, the Young's modulus of the support film 1132 may be the same or different to the Young's modulus of the support film 113. The Young's modulus of the soft film 111 may be the same or different to the Young's modulus of the soft films 1111. In other words, from a longitudinal view, the damping laminate 110 disposed under the electronic component 210 includes the support film 113, the soft films 1111, the support film 1132 and the soft film 111 with alternated high, low, high, low Young's moduli. By using the support film 113, the soft films 1111, the support film 1132 and the soft film 111 with alternated high, low, high, low Young's moduli, good cushioning property is provided to the electronic component 210.

Figure 7:
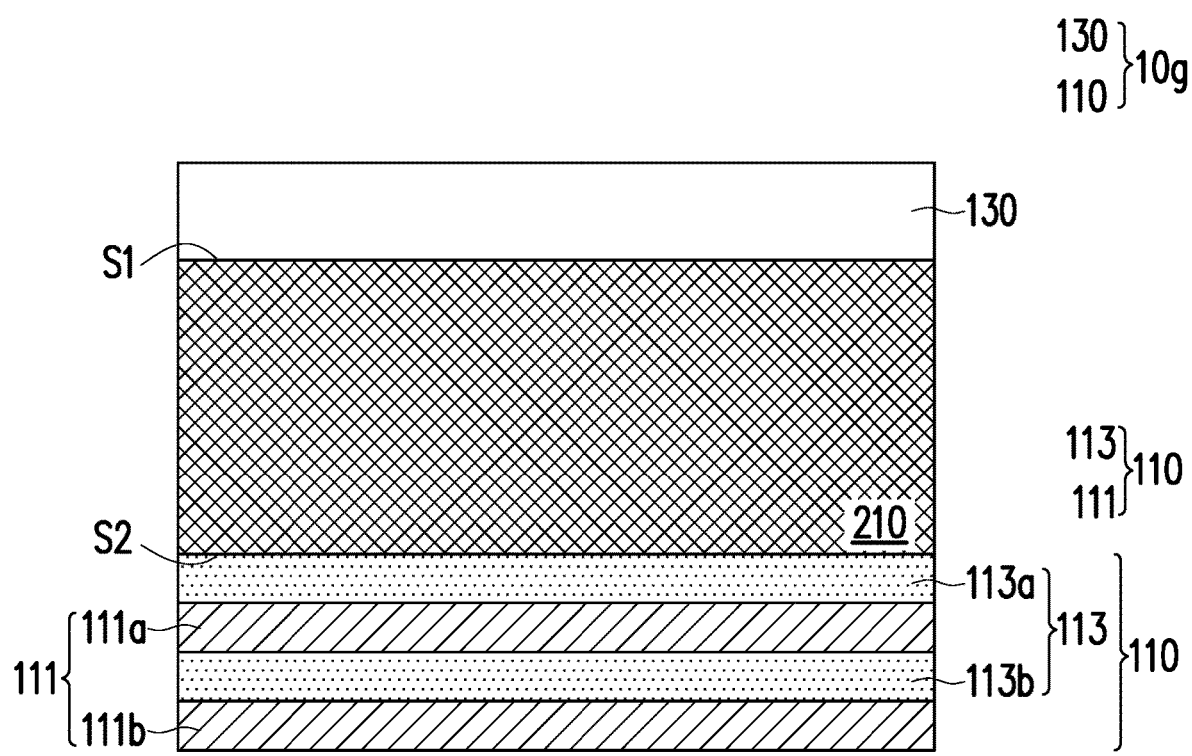

FIG. 7 is a cross-sectional view of an electronic device having an impact resistant structure according to an embodiment of the disclosure.

Referring to FIG. 7, the impact resistant structure 10g is similar to the impact resistant structure 10a1 of the embodiment of FIG. 1A, and a difference there between is that the soft films 111 and the support films 113 of the damping laminate 110 may construct a stacked layer of K layers, where K is a positive integer, and K is greater than 2. In some embodiments, the soft films 111 and the support films 113 in the stacked layer are arranged in alternation along a normal direction (for example, a vertical direction) of the second surface S2 of the electronic component 210, where the film located farthest from the electronic component 210 is the soft film 111, and the film located closest to the electronic component 210 is the support film 113. In some embodiments, in the stacked layer, the Young's modulus of each of the soft films 111 (111a, 111b) is gradually changed along with increase of the distance from the electronic component 210, and a variation trend thereof may be gradual increase or gradual decrease. The Young's modulus of each of the support films 113 (113a, 113b) is gradually changed along with increase of the distance from the electronic component 210, and a variation trend thereof may be gradual increase or gradual decrease. In the embodiment that that number of layers of the stacked layer is 4 (i.e. K=4), the stacked layer includes a first support film 113a, a first soft film 111a, a second support film 113b and a second soft film 111b. The first support film 113a is the closest to the electronic component 210, and the second soft film 111b is the farthest from the electronic component 210.

In some embodiments, the support film 113 that is the closest to the electronic component 210 is the first support film 113a, and a Young's modulus thereof is A1; the second support film 113b is located under the first support film 113a, and a Young's modulus thereof is A2, where the Young's modulus A1 is greater than the Young's modulus A2. The soft film 111 that is the closest to the electronic component 210 is the first soft film 111a, and a Young's modulus thereof is B1; the second soft film 111b is located under the first soft film 111a, and a Young's modulus thereof is B2, where the Young's modulus B1 is greater than the Young's modulus B2.

In some other embodiments, the thicknesses of the soft film 111 and the support film 113 in the stacked layer structure also present a pattern of gradual change, and the trend of thickness change may be gradual increase or gradual decrease, and through the design of composite multilayer structure, the material of the support film 113 is maintained within an elastic range, which is adapted to effectively transmit energy to the soft film 111, and meanwhile reduce an excessive strain capacity produced in internal or on a surface of the electronic product during the impact (to be within an elastic deformation range), so as to avoid function failure and mitigate a surface visual deformation amount of the electronic product after the impact.

Figure 8:
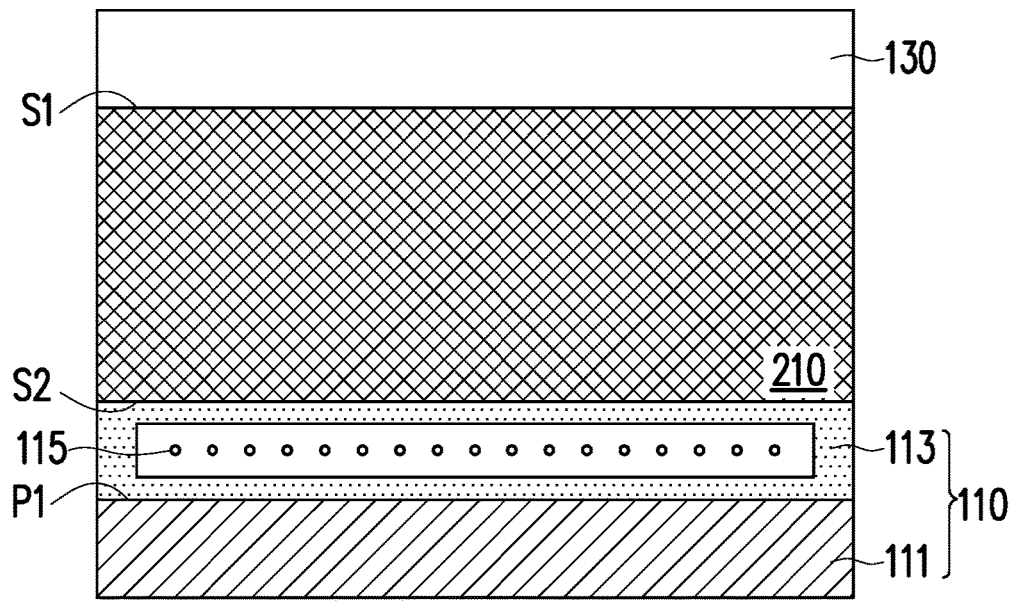

FIG. 8 is a cross-sectional view of an electronic device having an impact resistant structure according to an embodiment of the disclosure.

Referring to FIG. 8, in the impact resistant structure 10h, the support film 113 may encapsulate a fluid 115. By using the damping laminate 110 which includes the fluid 115 encapsulated by the support film 113, the electronic component 210 is separated from a neutral axis of the damping laminate 110, so as to reduce a surface bending stress. In some embodiment, a hollow structure may be formed in the support film 113, and then the fluid 115 is filled therein. The fluid 115 may be vacuum oil, silicon oil, low flow velocity fluid, air or a combination thereof.

Figure 9:
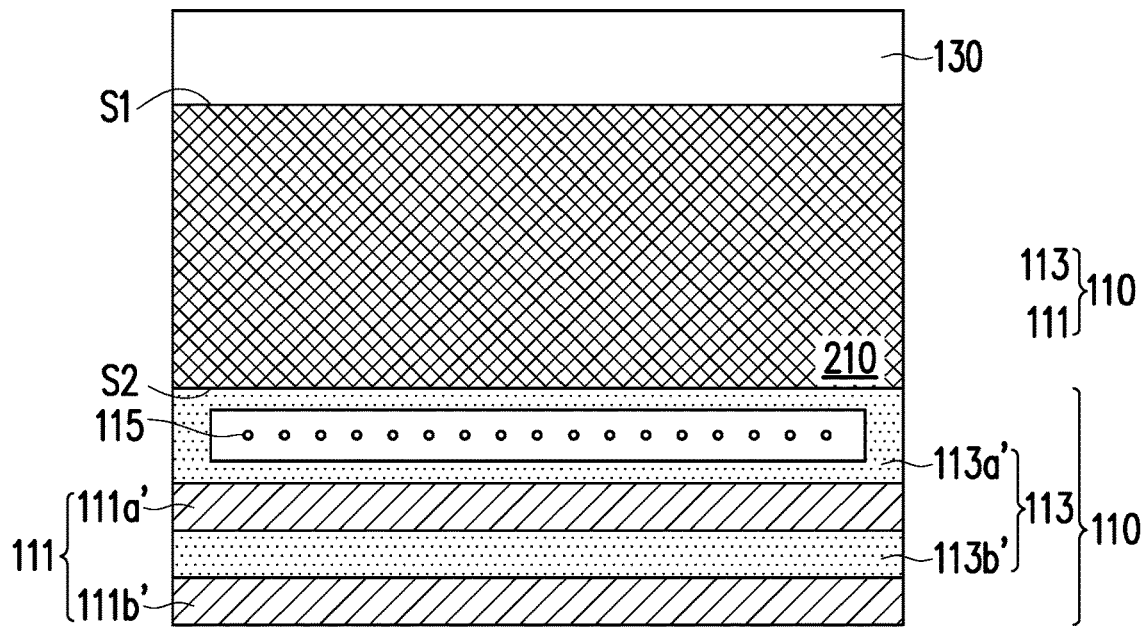

FIG. 9 is a cross-sectional view of an electronic device having an impact resistant structure according to an embodiment of the disclosure.

Referring to FIG. 9, the impact resistant structure 10i of the present embodiment is similar to the impact resistant structure 10g of the embodiment of FIG. 7, and a difference there between is that the first support film 113a is replaced by a first support film 113a' encapsulating the fluid 115. In some embodiments, in the stacked layer, the Young's modulus of each of the soft films 111 (111a', 111b') is gradually changed along with increase of the distance from the electronic component 210, and a variation trend thereof may be gradual increase or gradual decrease. The Young's modulus of each of the support films 113 (113a', 113b') is gradually changed along with increase of the distance from the electronic component 210, and a variation trend thereof may be gradual increase or gradual decrease. The fluid 115 may be vacuum oil, silicon oil, low flow velocity fluid, air or a combination thereof.

Figure 10:
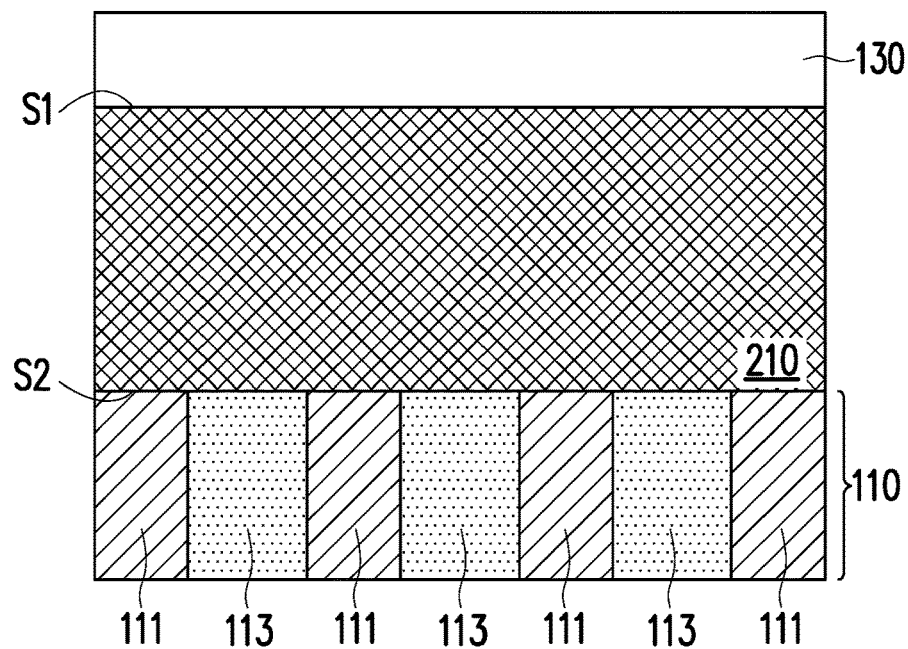

FIG. 10 is a cross-sectional view of an impact resistant structure having an electronic component according to an embodiment of the disclosure.

Referring to FIG. 10, in the impact resistant structure 10j, the soft films 111 and the support films 113 are arranged in alternation along a direction (for example, a horizontal direction) parallel to the second surface S2 of the electronic component 210. In some embodiments, the soft films 111 and the support films 113 are respectively strip-shaped. Top surfaces of the soft films 111 may be coplanar with and top surfaces of the support films 113, so as to be formed on the bottom of the electronic component 210 or other adhesive layer or optical layer. When the electronic component 210 is impacted, the harder support film 113 may maintain the structure, and the softer soft film 111 may buffer a lateral stress.

Figure 11A:
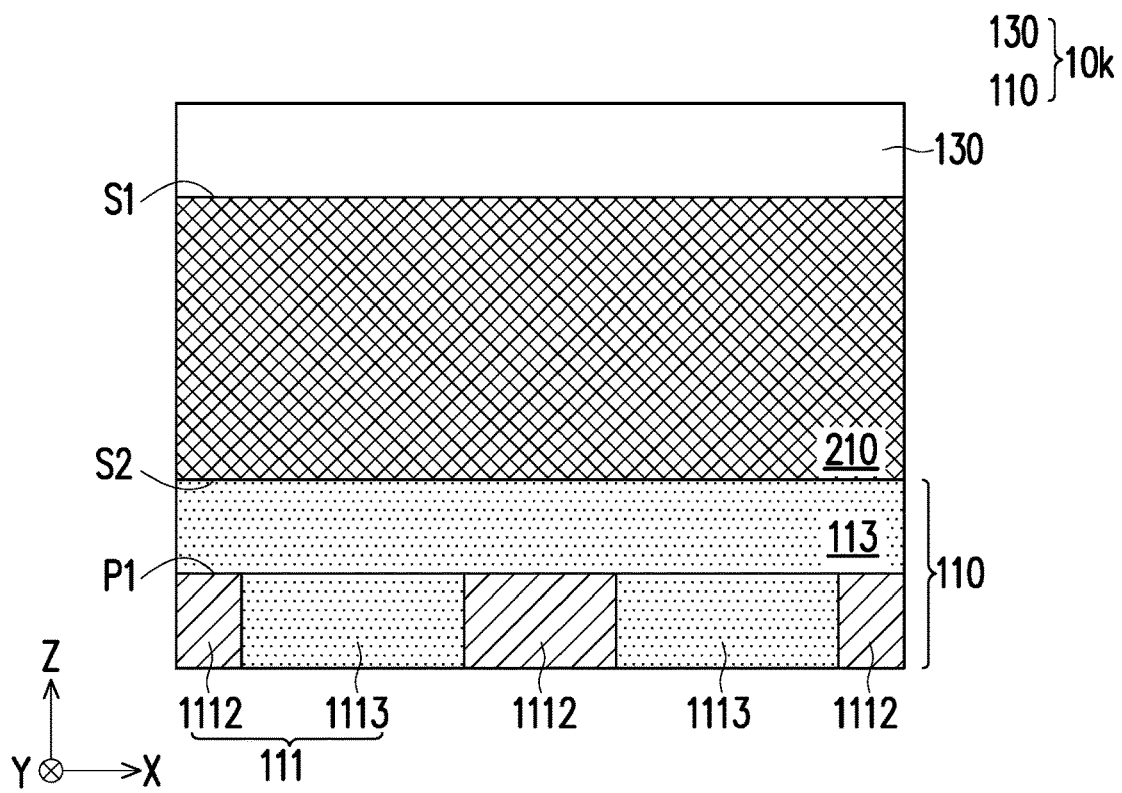
Figure 11B:
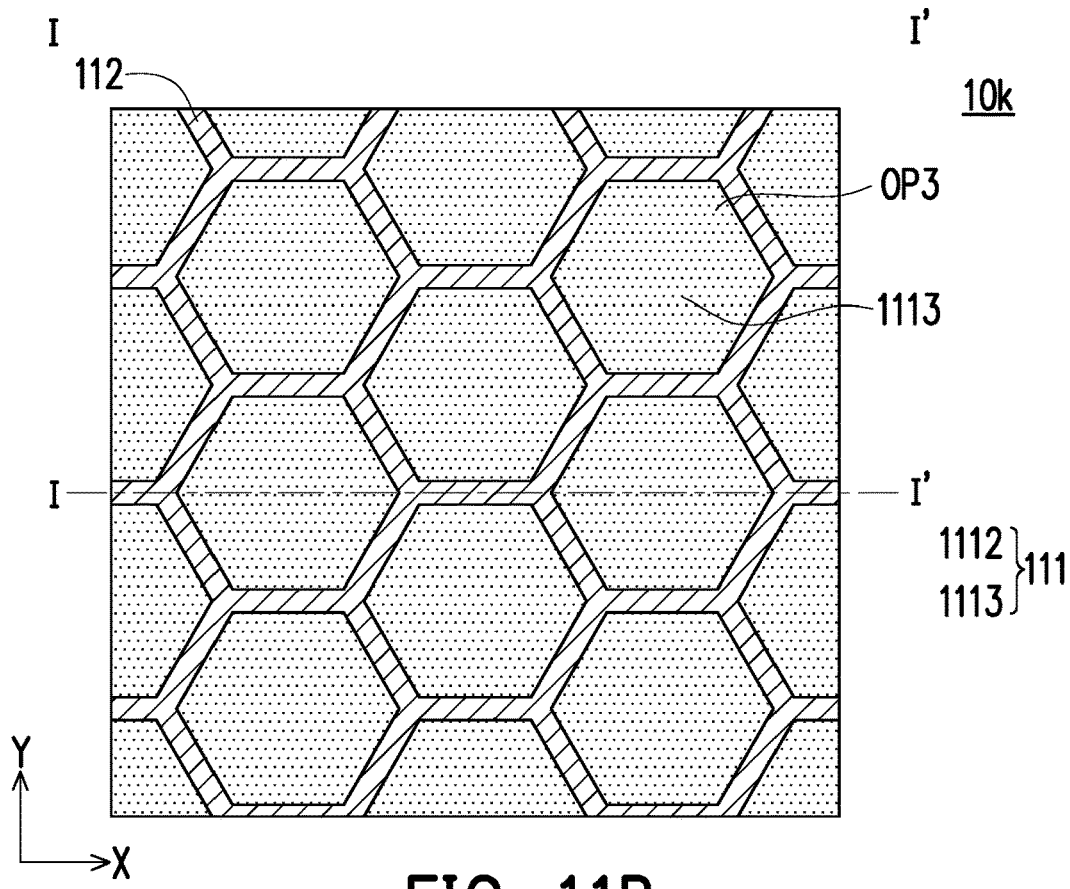
FIG. 11B is a top view of a soft film of the damping laminate of FIG. 11A along a line I-I'.

FIG. 11A is a cross-sectional view of an impact resistant structure having an electronic component according to an embodiment of the disclosure. FIG. 11B is a top view of the damping laminate of the embodiment of FIG. 11A. In other words, in FIG. 11B, the cross-sectional view along a line I-I' is the damping laminate 110 shown in FIG. 11A.

Referring to FIG. 11A, the impact resistant structure 10k is similar to the impact resistant structure 10a1 of the embodiment of FIG. 1A, and a difference there between is that the soft film 111 of the impact resistant structure 10k is composed of two kinds of materials, which are respectively patterned third soft films 1112 and fourth soft films 1113, where the patterned third soft films 1112 are harder than the fourth soft films 1113. Namely, a Young's modulus C1 of the patterned third soft film 1112 is higher than a Young's modulus C2 of the fourth soft film 1113. In some embodiments, the patterned third soft films 1112 may be a continuous or discontinuous patterned layer, and a plurality of openings OP3 is formed therein. A shape of the openings OP3 includes an arrangement of some geometric shapes, for example, triangles, rectangles, hexagons, rounds or a combination thereof. In the embodiment that the openings OP3 are hexagons, a pattern of the patterned third soft films 1112 is also referred as a honeycomb structure pattern. The fourth soft films 1113 are disposed in the openings OP3 of the patterned third soft films 1112, and top surfaces of the fourth soft films 1113 are coplanar with top surfaces of the patterned third soft films 1112, namely, the patterned third soft films 1112 and the fourth soft films 1113 are in a same plane. A Young's modulus of the patterned third soft film 1112 and a Young's modulus of the fourth soft film 1113 are all lower than the Young's modulus of the support film 113.

Referring to FIG. 11A and FIG. 11B, the cross-sectional view of FIG. 11B along the line I-I' is shown by the damping laminate 110 of FIG. 11A. The patterned third soft films 1112 of the damping laminate 110 have a honeycomb structure pattern. The impact resistant structure 10k is similar to the impact resistant structure 10a1 of the embodiment of FIG. 1A, and a difference there between is that the soft film 111 of the damping laminate 110 of the impact resistant structure 10k is composed of two kinds of materials, which are respectively the patterned third soft films 1112 and the fourth soft films 1113, where the patterned third soft films 1112 have the honeycomb structure pattern, and are configured with a plurality of openings OP3. The fourth soft films 1113 are disposed in the openings OP3. The patterned third soft films 1112 are harder than the fourth soft films 1113. Namely, the Young's modulus of the patterned third soft film 1112 is higher than the Young's modulus of the fourth soft film 1113.

In the aforementioned embodiments of FIG. 4 to FIG. 11A, the impact resistant structure including the damping laminate 110 and the resistance stack layer 130 is taken as an example for description, however, in some other embodiments, the impact resistant structure of the disclosure may also include the damping laminate 110 without including the resistance stack layer 130. In other words, the impact resistant structure of the other embodiments is similar to the impact resistant structures of FIG. 4 to FIG. 11A, but does not include the damping laminate 110.

Figure 12:
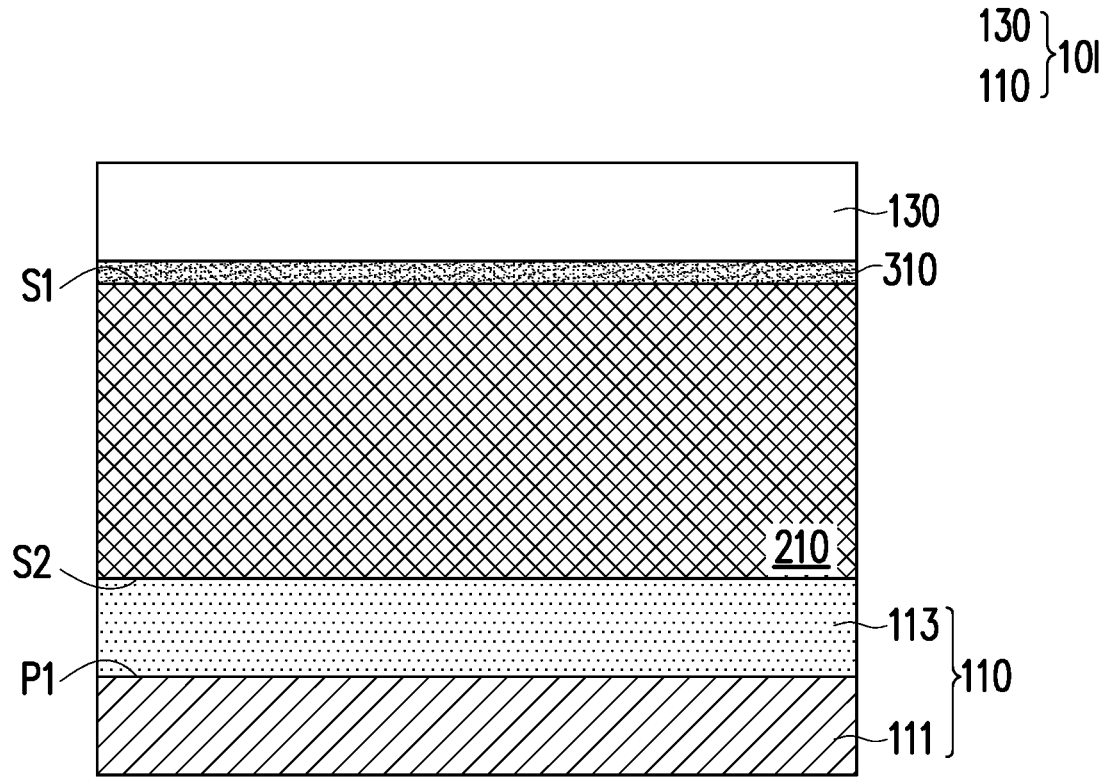

FIG. 12 is a cross-sectional view of an electronic device having an impact resistant structure according to an embodiment of the disclosure.

Referring to FIG. 12, the impact resistant structure 101 is similar to the impact resistant structure 10a1 of the embodiment of FIG. 1A, and a difference there between is that an optical layer 310 is further included between the electronic component 210 and the resistance stack layer 130. The optical layer 310 may be a black filter layer, and an optical transmittance of an optical path thereof along a Z-axis is less than 30%. In some other embodiments, the optical layer 310 may be a color filter layer, and an optical transmittance of the optical path thereof along the Z-axis is 70% to 98%. The optical layer 310 may be an insulator, a semiconductor, a conductor or a combination thereof. The optical layer 310 may be a single layer film or a multilayer film. In other some embodiments, the optical layer 310 may be a circular polarizer layer (CPL). The circular polarizer layer comprises, for example, a polarizing layer and a phase retardation layer. For example, the polarizing layer may be a linear polarizing layer and the phase retardation layer may be a quarter-wave retarder plate.

In other embodiments, an optical layer may also be included between the electronic component 210 and the damping laminate 110.

Effects of the protective structure of the embodiments of the disclosure and experiments and simulations are described below.

Experiment Example

In the present experiment, the electronic device having the impact resistant structure 10a1 and the electronic component 210 shown in FIG. 1A is taken as a sample A to perform a falling ball impact test. In other words, the sample A is a stack structure sequentially including the soft film 111, the support film 113, the electronic component 210 and the resistance stack layer 130 from the bottom to the top. The soft film 111 is silicone, and a thickness thereof is 1700 μm, and a Young's modulus thereof is 0.046 GPa. The support film 113 is a metal foil stainless steel material, a thickness thereof is 30 μm, and a Young's modulus thereof is 193 GPa. The resistance stack layer 130 is a scratch resistant wear protective layer, and a material thereof is pentaerythritol tri (meth) acrylate or acrylate and polyimide (HC/PI), a thickness thereof is 40 μm, and a Young's modulus thereof is 11.728 GPa. The electronic component 210 is a light-emitting component, a thickness thereof is 84.24 μm, and a Young's modulus thereof is 10.265 GPa. An experiment condition is to use an acrylic ball of 135 grams to drop from a height of 35 cm direct above the resistance stack layer 130, so as to test an impact resistant capability of the aforementioned impact resistant structure. An experiment result shows that after 131 repeated falling ball impact tests, a light-emitting region of the electronic component 210 still normally works.

Comparison Example

A sample B used in the comparison example, is similar to the sample A used in the experiment example, though the soft film 111 and the support film 113 are not included. In other words, the sample B sequentially includes the electronic component 210 and the resistance stack layer 130 from the top to the bottom. The resistance stack layer 130 is a scratch resistant wear protective layer, and a material thereof is pentaerythritol tri (meth) acrylate or acrylate and polyimide (HC/PI), a thickness thereof is 40 μm, and a Young's modulus thereof is 11.728 GPa. The electronic component 210 is a light-emitting component, a thickness thereof is 84.24 μm, and a Young's modulus thereof is 10.265 GPa. After the test is performed in the same test condition, the light-emitting region of the electronic component 210 cannot normally work. The experiment result shows that the electronic component only having the resistance stack layer cannot pass through the falling ball impact test, and the protection capability of the impedance stack layer is not enough to completely protect function integrity of the electronic component.

Simulation Example 1

A finite element method (FEM) is adopted to respectively simulate surface maximum normal stress to a stacked structure A and a stacked structure B. The stacked structure A is similar to the sample A, and the stacked structure B is similar to the sample B.

A simulation result shows that a positive maximum stress in the stacked structure A is 247.9 MPa, a vertical strain is −1.577%; and a positive maximum stress in the stacked structure B is 281 MPa, a vertical strain is −2.179%. A total displacement amount of the stacked structure A is reduced by 25% compared to the stacked structure B. A decline degree of the maximum normal stress of the stacked structure A configured with the damping laminate is greater than 12%, so that the impact resistant capability of the electronic device is improved.

Simulation Example 2

Figure 14:
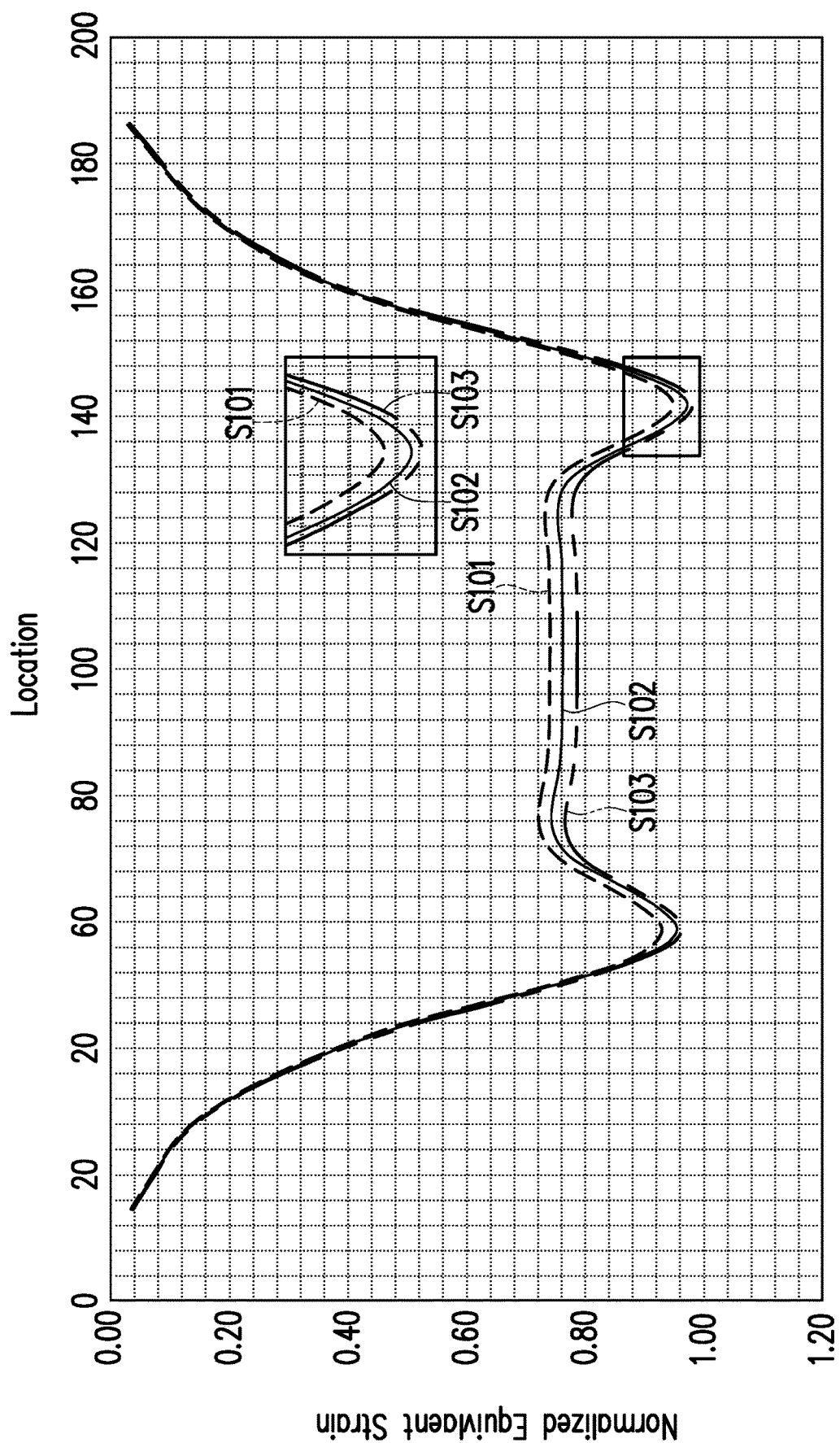
FIG. 14 shows a simulation result of a pencil drop test for various samples.

In the present experiment, the electronic device having the impact resistant structure 10a1 and the electronic component 210 shown in FIG. 13B is taken as a sample C1 to perform a pencil drop test. In other words, the sample C1 is a stacked structure sequentially including a soft film 111, a support film 113, an electronic component 210, and a resistance stack layer 130 from the bottom to the top. The soft film 111 is formed of silicone, and a thickness thereof is 30 μm, and a Young's modulus thereof is 0.1 GPa. The support film 113 is formed of a metal foil stainless steel material, a thickness thereof is 30 μm, and a Young's modulus thereof is 75 GPa. The resistance stack layer 130 is diamond-like carbon, a thickness thereof is 1 μm, and a Young's modulus thereof is 50 GPa. The electronic component 210 is TFT backplane, a thickness thereof is 2.4 μm, a Young's modulus thereof is 46 GPa. An Experimental condition was to use a pencil with a weight of 10 grams and a diameter of 1 mm to 1.2 mm to drop from a height of 25 cm direct above the resistance stack layer 130, so as to test an impact resistant capability of the aforementioned impact resistant structure. A simulation result is shown as curve S101 in FIG. 14. The results show that a stress of the electronic component 210 is 2176 MPa, and a failure validation coefficient (FVC) of the electronic component 210 is 2.57.

Simulation Example 3

In the present experiment, the electronic device having the impact resistant structure 10a1 and the electronic component 210 shown in FIG. 13B is taken as a sample C2 to perform a pencil drop test. In other words, the sample C2 is a stacked structure sequentially including a soft film 111, a support film 113, an electronic component 210, and a resistance stack layer 130 from the bottom to the top. The soft film 111 is formed of soft filler, and a thickness thereof is 30 μm, and a Young's modulus thereof is 3 GPa. The support film 113 is formed of PET, a thickness thereof is 150 μm, and a Young's modulus thereof is 5 GPa. The resistance stack layer 130 is diamond-like carbon, a thickness thereof is 1.0 μm, and a Young's modulus thereof is 50 GPa. The electronic component 210 is TFT backplane, a thickness thereof is 2.4 μm, a Young's modulus thereof is 46 GPa. An Experimental condition was to use a pencil with a weight of 10 grams and a diameter of 1 mm to 1.2 mm to drop from a height of 25 cm direct above the resistance stack layer 130, so as to test an impact resistant capability of the aforementioned impact resistant structure. A simulation result is shown as curve S102 in FIG. 14. The results show that a stress of the electronic component 210 is 2444 MPa, and a failure validation coefficient (FVC) of the electronic component 210 is 2.91.

Comparative Simulation Example

The sample D used in the comparative simulation example is similar to the sample C1, but does not include the soft film 111, and the support film 113 has different Young's modulus. The sample D is a stacked structure sequentially including the support film 113, an electronic component 210, and a resistance stack layer 130 from the bottom to the top. The support film 113 is PET, a thickness thereof is 150 μm, a Young's modulus thereof is 3.1 GPa. The resistance stack layer 130 is diamond-like carbon, a thickness thereof is 1 μm, and a Young's modulus thereof is 50 GPa. The electronic component 210 is TFT backplane, a thickness thereof is 2.4 μm, a Young's modulus thereof is 46 GPa. An Experimental condition was to use a pencil with a weight of 10 grams and a diameter of 1 mm to 1.2 mm to drop from a height of 25 cm direct above the resistance stack layer 130, so as to test an impact resistant capability of the aforementioned impact resistant structure. A simulation result is shown as curve S103 in FIG. 14. The results show that a stress of the electronic component 210 is 2985 MPa, and a failure validation coefficient (FVC) of the electronic component 210 is 3.52.

The results show that, compared with the comparative simulation example, the simulation example 3 uses PET with a higher Young's modulus as the support film, and a filler layer with a lower Young's modulus is added below the PET as the soft film, and thereby the stress of the electronic component 210 may be reduced from 2985 MPa to 2444 MPa, and the FVC may be reduced from 3.52 to 2.91. When the material of the support film is changed to a metal foil with a higher Young's modulus, and a silicone with a lower Young's modulus is used as the soft film, the stress of the electronic component 210 may be further reduced to 2176 MPa, and the FVC may be reduced to 2.57. The results show that the FVC of the simulation examples 2 and 3 are both less than 3, which is a low risk of failure, while the FVC of the comparative simulation example is greater than 3, which is a high risk of failure.

In the TFT backplane, boundary region between the TFT layer and the substrate is a critical zone. According to past AMOLED stress simulation experience, when the TFT layer is subjected a strain of 3%, there is a risk of failure. Compared with the comparative simulation example, the simulation examples 2 and 3 may improve the strain of the critical zone by at least 3%. Therefore, the impact resistant structure having the resistance stack layer and the damping laminate of the disclosure may be formed or adhered on an electronic component (for example, a flexible electronic component), so as to reduce the impact of external force on the electronic component and effectively reduce the failure risk of the electronic component. Therefore, service life and reliability of the electronic product may be improved.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:
1. An impact resistant structure for an electronic component, comprising:
 a resistance stack layer, disposed on a first surface of the electronic component, wherein a thickness of the resis- tance stack layer is less than 10 μm, and a Young's modulus of the resistance stack layer is between 40 GPa and 150 GPa; and a damping laminate, disposed on a second surface of the electronic component, wherein the second surface of the electronic component is opposite to the first surface, and the damping laminate comprises:

a relative soft film; and a support film, disposed between the relative soft film and the electronic component, wherein a Young's modulus of the relative soft film is smaller than a Young's modulus of the support film.

2. The impact resistant structure as claimed in claim 1, wherein a thickness of the resistance stack layer is between 0.1 μm and 10 μm.

3. The impact resistant structure as claimed in claim 1, wherein a Young's modulus of the electronic component is between 30 GPa and 70 GPa.

4. The impact resistant structure as claimed in claim 1, wherein a thickness of the electronic component is between 0.5 μm and 30 μm.

5. The impact resistant structure as claimed in claim 1, wherein a Young's modulus of the support film is between 2 GPa and 150 GPa.

6. The impact resistant structure as claimed in claim 1, wherein a thickness of the support film is between 30 μm and 500 μm.

7. The impact resistant structure as claimed in claim 1, wherein a Young's modulus of the relative soft film is between 0.001 GPa and 3 GPa.

8. The impact resistant structure as claimed in claim 1, wherein a thickness of the relative soft film is between 30 μm and 1000 μm.

9. The impact resistant structure as claimed in claim 1, wherein a material of the support film comprises poly (methyl methacrylate) (PMMA), polycarbonate (PC), polyethersulfone (PES), polyamide (PA), poly (ethylene terephthalate) (PET), polyetheretherketone (PEEK), polyethylene naphthalate (PEN), polyethylenimine (PEI), polyurethane (PU), polydimethylsiloxane (PDMS), acrylic, ether series of polymers, polyolefin, metal, glass, fiber composition, or a combination thereof.

10. The impact resistant structure as claimed in claim 1, wherein a material of the relative soft film comprises silicone, rubber, acrylonitrile butadiene styrene resin, polyethylenimine (PEI), polyurethane (PU), an adhesive, a filler, thermoplastic urethane (TPU) or a combination thereof.

11. The impact resistant structure as claimed in claim 1, wherein a material of the resistance stack layer comprises polyimide (PI), poly (methyl methacrylate) (PMMA), polycarbonate (PC), polyethersulfone (PES), polyamide (PA), poly (ethylene terephthalate) (PET), polyetheretherketone (PEEK), polyethylene naphthalate (PEN), polyethylenimine (PEI), polyurethane (PU), polydimethylsiloxane (PDMS), acrylic, ether series of polymers, polyolefin, amorphous carbon material, diamond-like carbon (DLC), or a combination thereof.

12. An impact resistant structure for an electronic component, comprising:

a resistance stack layer, disposed on a first surface of the electronic component, wherein a thickness ratio of the resistance stack layer to the electronic component is between 0.02 and 6, and a Young's modulus ratio of the resistance stack layer to the electronic component is between 0.57 and 5; and a damping laminate, disposed on a second surface of the electronic component, wherein the second surface of the electronic component is opposite to the first surface, and the damping laminate comprises:

a relative soft film; and a support film, disposed between the relative soft film and the electronic component, wherein a Young's modulus of the relative soft film is smaller than a Young's modulus of the support film.

13. The impact resistant structure as claimed in claim 12, wherein a Young's modulus ratio of the relative soft film to the support film is larger than $6.6 \times 10^{-7}$.

14. The impact resistant structure as claimed in claim 12, wherein a thickness ratio of the relative soft film to the support film is between 1 and 33.33.

15. The impact resistant structure as claimed in claim 12, wherein a Young's modulus ratio of the electronic component to the damping laminate is between 0.2 and 3.5.

16. The impact resistant structure as claimed in claim 12, wherein a thickness ratio of the electronic component to the damping laminate is between 0.001 and 0.96.

17. The impact resistant structure as claimed in claim 12, wherein a material of the support film comprises poly (methyl methacrylate) (PMMA), polycarbonate (PC), polyethersulfone (PES), polyamide (PA), poly (ethylene terephthalate) (PET), polyetheretherketone (PEEK), polyethylene naphthalate (PEN), polyethylenimine (PEI), polyurethane (PU), polydimethylsiloxane (PDMS), acrylic, ether series of polymers, polyolefin, metal, glass, fiber composition, or a combination thereof.

18. The impact resistant structure as claimed in claim 12, wherein a material of the relative soft film comprises silicone, rubber, acrylonitrile butadiene styrene resin, polyethylenimine (PEI), polyurethane (PU), an adhesive, a filler, thermoplastic urethane (TPU) or a combination thereof.

19. The impact resistant structure as claimed in claim 12, wherein a material of the resistance stack layer comprises polyimide (PI), poly (methyl methacrylate) (PMMA), polycarbonate (PC), polyethersulfone (PES), polyamide (PA), poly (ethylene terephthalate) (PET), polyetheretherketone (PEEK), polyethylene naphthalate (PEN), polyethylenimine (PEI), polyurethane (PU), polydimethylsiloxane (PDMS), acrylic, ether series of polymers, polyolefin, amorphous carbon material, diamond-like carbon (DLC), or a combination thereof.

20. An electronic device, comprising:

an electronic component; and the impact resistant structure, the resistance stack layer or the damping laminate as claimed in claim 1, disposed on the electronic component.

* * * * *

UNITED STATES PATENT AND TRADEMARK OFFICE
CERTIFICATE OF CORRECTION

PATENT NO. : 11,007,751 B2
APPLICATION NO. : 16/729520
DATED : May 18, 2021
INVENTOR(S) : Jui-Chang Chuang et al.

Page 1 of 1

It is certified that error appears in the above-identified patent and that said Letters Patent is hereby corrected as shown below:

On the Title Page

Item (63) should read:
Continuation-in-part of application No. 16/039,336, filed on Jul. 19, 2018

Signed and Sealed this
Twentieth Day of July, 2021

Drew Hirshfeld
*Performing the Functions and Duties of the*
*Under Secretary of Commerce for Intellectual Property and*
*Director of the United States Patent and Trademark Office*